United States Patent
Omizo et al.

(10) Patent No.: US 7,276,784 B2
(45) Date of Patent: Oct. 2, 2007

(54) SEMICONDUCTOR DEVICE AND A METHOD OF ASSEMBLING A SEMICONDUCTOR DEVICE

(75) Inventors: Shoko Omizo, Kanagawa (JP); Mikio Matsui, Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/246,150

(22) Filed: Oct. 11, 2005

(65) Prior Publication Data

US 2006/0079020 A1    Apr. 13, 2006

(30) Foreign Application Priority Data

Oct. 13, 2004   (JP) ................... P2004-298740

(51) Int. Cl.
*H01L 23/02* (2006.01)
(52) U.S. Cl. .............. 257/678; 257/700; 257/E21; 257/503; 257/511
(58) Field of Classification Search ............ 257/678, 257/700, 701, 702, 703, 705, 760, 762, 765, 257/771, 787, 792, 793, 794
See application file for complete search history.

(56) References Cited

U.S. PATENT DOCUMENTS

| | | | |
|---|---|---|---|
| 6,025,648 A * | 2/2000 | Takahashi et al. | 257/778 |
| 6,287,892 B1 * | 9/2001 | Takahashi et al. | 438/107 |
| 6,313,522 B1 * | 11/2001 | Akram et al. | 257/686 |
| 6,451,624 B1 * | 9/2002 | Farnworth et al. | 438/106 |
| 6,469,374 B1 * | 10/2002 | Imoto | 257/686 |
| 6,686,222 B2 | 2/2004 | Omizo et al. | |

FOREIGN PATENT DOCUMENTS

| | | |
|---|---|---|
| JP | 11-103158 | 4/1999 |
| JP | 2000-286380 | 10/2000 |
| JP | 2003-7972 | 1/2003 |
| JP | 2004-47702 | 2/2004 |

OTHER PUBLICATIONS

Notification of Reason(s) for Refusal Issued by the Korean Patent Office on Sep. 27, 2006, for Korean Patent Application No. 10-2005-95935 and English-language translation thereof.
Notification of the Reasons for Refusal on the first examination issued by the Chinese Patent Office on May 18, 2007, in Chinese Patent Application No. 200510108390.5, Japanese-language version of the Notification, and English-language translation of the Japanese-language version of the Notification.

* cited by examiner

*Primary Examiner*—David Nhu
(74) *Attorney, Agent, or Firm*—Finnegan, Henderson, Farabow, Garrett & Dunner, L.L.P.

(57) ABSTRACT

A semiconductor device includes a base substrate; a first fixing layer provided on the base substrate; a first semiconductor chip fixed on the first fixing layer; a first substrate provided above the first semiconductor chip; a plurality of first connection members isolated from the first semiconductor chip, electrically connecting to the first substrate with the base substrate; and a first encapsulating layer provided around the first connection members.

10 Claims, 7 Drawing Sheets

SEMICONDUCTOR DEVICE AND A METHOD OF ASSEMBLING A SEMICONDUCTOR DEVICE

CROSS REFERENCE TO RELATED APPLICATIONS AND INCORPORATION BY REFERENCE

This application is based upon and claims the benefit of priority from prior Japanese Patent Application No. P2004-298740, filed on Oct. 13, 2004; the entire contents of which are incorporated herein by reference.

BACKGROUND OF THE INVENTION

1. Field of the Invention

The present invention relates to a semiconductor device, more specifically to a semiconductor device having a plurality of chips stacked so as to implement a three-dimensional (3-D) configuration and a method of assembling the semiconductor device.

2. Description of the Related Art

With movement toward higher levels of integration and improved functions of electric devices in recent years, various assembling methods for 3-D chip stacking technology have been developed.

As a commonly used method for assembling a semiconductor device, a core board, which serves as an intermediate layer, is sandwiched between a lower-layer semiconductor package and an upper-layer semiconductor package. Then, the core board and the lower-layer and upper-layer semiconductor packages are fixed by use of thermo compression. The lower-layer and upper-layer semiconductor packages can be connected with a plurality of vias buried in the core board.

To improve electrical connection between the upper-layer and lower-layer semiconductor packages, a fluctuation of the height of the vias buried in the core board have to be suppressed. However, since the vias are formed by plating, a number of platings have to be processed to control the height of vias. This as a result, complicates manufacturing process and decreases manufacturability.

As another assembling method for the semiconductor device, the upper-layer and the lower-layer semiconductor packages are stacked and connected directly with a plurality of bumps without using the intermediate layer. However, since an alignment between the lower-layer and upper-layer semiconductor packages is difficult, a misalignment between the lower-layer and upper-layer semiconductor packages occurs.

SUMMARY OF THE INVENTION

An aspect of the present invention inheres in a semiconductor device encompassing a base substrate; a first fixing layer provided on the base substrate; a first semiconductor chip fixed on the first fixing layer; a first substrate provided above the first semiconductor chip; a plurality of first connection members isolated from the first semiconductor chip, electrically connecting to the first substrate with the base substrate; and a first encapsulating layer provided around the first connection members.

Another aspect of the present invention inheres in a method of assembling a semiconductor device encompassing providing a first fixing layer on a base substrate; facing a first substrate to the base substrate, the first substrate attaching a first semiconductor chip under a bottom surface of the first substrate; fixing the first semiconductor chip to the first fixing layer; providing a plurality of first connection members between the first substrate and the base substrate so as to connect the first substrate and the base substrate; and providing a first substrate encapsulating layer around the first connection members.

DETAILED DESCRIPTION OF THE INVENTION

Figure 1:
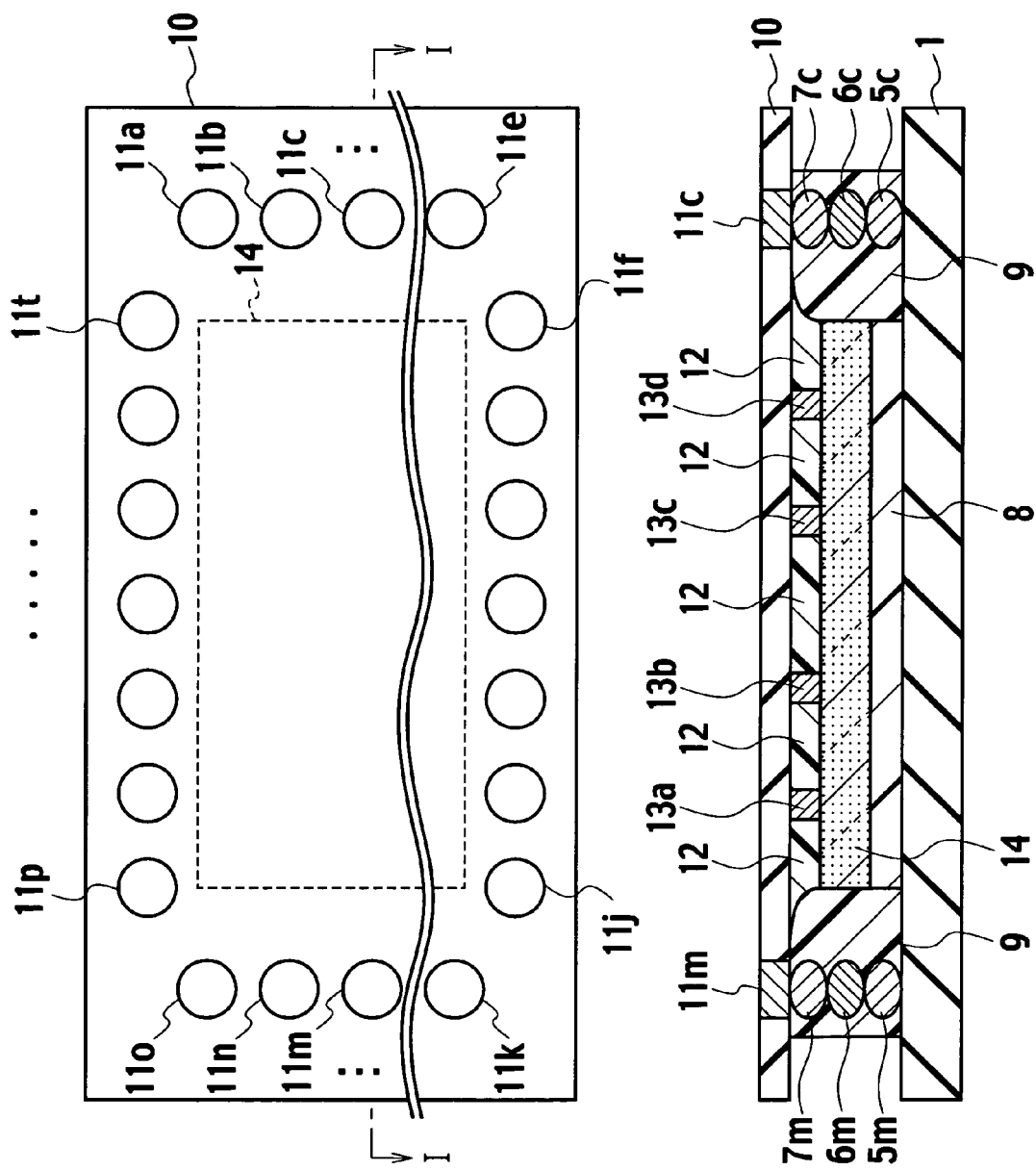
FIG. 1A is a plan view viewed from the first substrate of a semiconductor device according to a first embodiment of the present invention.
FIG. 1B is a cross-sectional view taken on line I-I in FIG. 1A according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth such as specific signal values, etc. to provide a thorough understanding of the present invention. However, it will be obvious to those skilled in the art that the present invention may be practiced without such specific details.

Prepositions, such as "on", "over", "under", "beneath" and "normal" are defined with respect to a planar surface of a substrate, regardless of the orientation in which the substrate is actually held. A layer is on another layer even if there are intervening layers.

FIRST EMBODIMENT

As shown in FIGS. 1A and 1B, a semiconductor device according to the first embodiment of the present invention includes base substrate 1, a first fixing layer 8 provided on the base substrate 1, a first semiconductor chip 14 fixed on the first fixing layer 8, and a first substrate 10 provided above the first semiconductor chip 14. A plurality of first connection members (first lower joints 5c, 5m, first intermediate joints 6c, 6m, first upper joints 7c, 7m) are isolated from the first semiconductor chip 14 and electrically connecting the first substrate 10 with base substrate 1. A first encapsulating layer 9 is provided around the first connection members 5c, 5m, 6c, 6m, 7c, and 7m.

As a material of the base substrate 1, various organic synthetic resins and inorganic materials including ceramic and glass can be used. Among organic synthetic resins, phenolic resin, polyester resin, epoxy resin, polyimide resin, fluoroplastic can be used. Meanwhile, paper, woven glass fabric, a glass backing material, or the like is used as a backing material that becomes a core in forming a slab-shaped structure. As a general inorganic base material, ceramic can be used. Alternatively, a metal substrate is used in order to improve the heat-radiating characteristics. In the case where a transparent substrate is needed, glass is used. As a ceramic substrate, alumina ($Al_2O_3$), mullite ($3Al_2O_3 \cdot 2SiO_2$), beryllia (BeO), aluminum nitride (AlN), silicon nitride (SiN) can be used. Furthermore, a lead frame in which a polyimide resin plate having high thermal resistance is laminated onto metal, such as iron or copper, can be used.

The first fixing layer 8 has an outer contour aligned with a contour of the first semiconductor chip 14. The first fixing layer 8 is positioned on an area of the base substrate 1 where the first semiconductor chip 14 is mounted. The first fixing layer 8 is adhered to the bottom surface of the first semiconductor chip 14. As a material of the first fixing layer 8, a synthetic resin made of epoxy resin or acrylic resin can be used. The synthetic resin includes a liquid resin and a resin sheet (film). As a material for the first fixing layer of FIG. 1B, the resin sheet may be suitable because the resin sheet is easier to handle and can control thickness and shape of the resin compared to the case where the liquid resin is used.

A plurality of circuit elements (not shown) is formed on a top surface of the first semiconductor chip 14. For example, the circuit elements include heavily doped impurity regions doped with donors or acceptors of approximately $1 \times 10^{18}$ cm$^{-3}$ to $1 \times 10^{21}$ cm$^{-3}$ (such as source regions and drain regions or emitter regions and collector regions) or the like. Insulating films are stacked into a multi-level structure on the circuit elements. Metallic interconnections made of aluminum (Al) aluminum alloy (Al—Si or Al—Cu—Si) or the like are alternatively stacked into the insulating films so as to connect the circuit elements. On the uppermost layer of the insulating films, bonding pads (not shown) are formed.

First chip connection electrodes 13a, 13b, 13c, and 13d are connected to the bonding pads. Materials and concrete shapes of the first chip connection electrodes 13a, 13b, 13c, and 13d are not limited. For example, the first chip connection electrodes 13a, 13b, 13c, and 13c may be made of solder balls or gold stud bumps.

The first chip connection electrodes 13a, 13b, 13c, and 13d are connected to wirings (not shown), which are provided on the bottom surface of the first substrate 10. The first semiconductor chip 14 is mounted in a face down configuration on the first substrate 10 with flip chip connection. A first chip covering layer 12 is provided around the first chip connection electrodes 13a, 13b, 13c, and 13d. As a material of the first chip covering layer 12, a synthetic resin made of epoxy resin or acrylic resin can be used. Both of the resin sheet and liquid resin can be used as the first chip covering layer 12. Herein, FIG. 1B illustrates the flip-chip bonding device. However, the first semiconductor chip 14 can be mounted with bonding wires in place of solder balls or stud bumps.

The first substrate 10 can be made from polyimide or glass epoxy and has a thickness of about 0.15 mm. A plurality of via plugs 11c, 11m, . . . are buried in the first substrate 10. As shown in FIG. 1B, the via plugs 11c, 11m, . . . penetrate through the top surface and bottom surface of the first substrate 10. As shown in FIG. 1A, the via plugs 11c, 11m, . . . are provided so as to surround the first semiconductor chip 14. The first connection members (the first upper joint 7c, the first intermediate joint 6c, and the first lower joint 5c) are connected under the via plug 11c. The first lower joint 5c is connected to a wiring (not shown), which is provided on the base substrate 1.

The first connection members (the first upper joint 7m, the first intermediate joint 6m, and the first lower joint 5m) are connected under the via plug 11m. The first lower joint 5m is connected to a wiring (not shown), which is provided on the base substrate 1.

As materials of the first upper joints 7c, 7m, the first intermediate joints 6c, 6m, the first lower joints 5c, 5m, ball electrodes made of solder (Pb) can be suitable. Alloys made of Tin-Copper (Sn—Cu), Tin-Silver (Sn—Ag), Tin-Silver-Copper (Sn—Ag—Cu), or Tin-Antimony (Sn—Sb) can also be used as the first connection members 5c, 5m, 6c, 6m, 7c, and 7m.

The first encapsulating layer 9 encapsulates the first upper joint 7c, 7m, the first intermediate joint 6c, 6m, and the first lower joint 5c, 5m. As a material of the first encapsulating layer 9, a synthetic resin made of epoxy resin or acrylic resin can be used. The liquid resin, such as a reactive liquid resin with a solder fluxing function for soldering interconnect (a non-flow underfill) may be used as the first encapsulating layer 9. The first encapsulating layer 9, the first fixing layer 8, and the first chip covering layer 12 may be made of the same material considering the decrease of the reliability by peeling and adhesion strength between the interfaces of layers.

In the semiconductor device according to the first embodiment of the present invention, the first fixing layer 8 is provided under the first semiconductor chip 14. Therefore, the misalignment can be suppressed when the first lower joints 5c, 5m, the first intermediate joints 6c, 6m, and the first upper joints 7c, 7m are provided between the base substrate 1 and the first substrate 10. The misalignment caused by the flowage of the first encapsulating layer 9 during assembling the first substrate 10 on the base substrate 1 can also be suppressed. Accordingly, the semiconductor device according to the first embodiment can be assembled with high accuracy.

Figure 2:
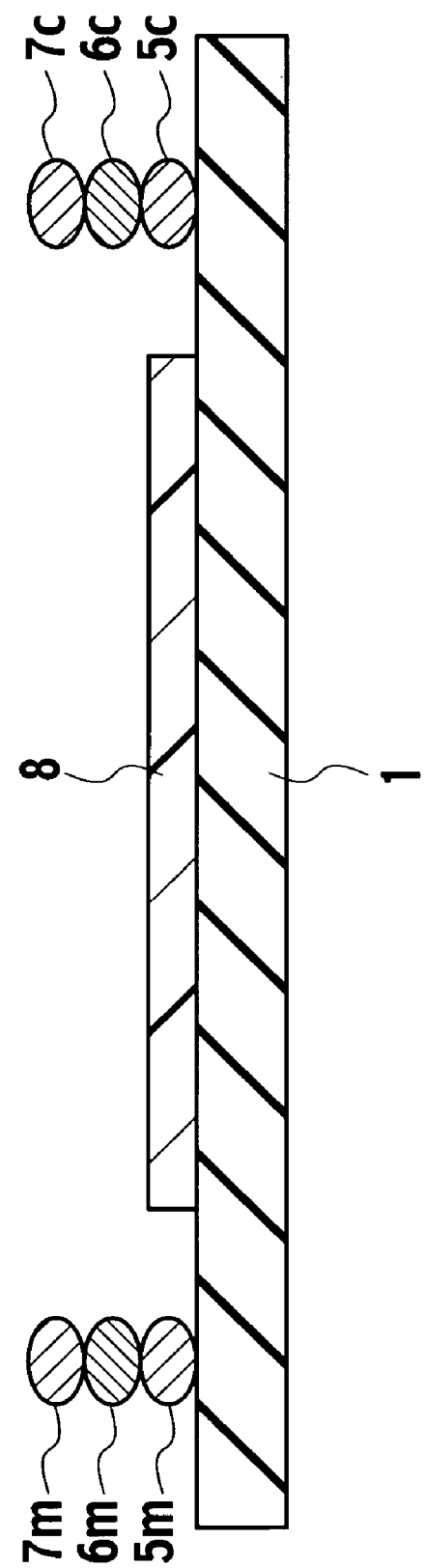
FIG. 2 is across-sectional view illustrating a method of assembling a semiconductor device according to the first embodiment of the present invention.
Figure 3:
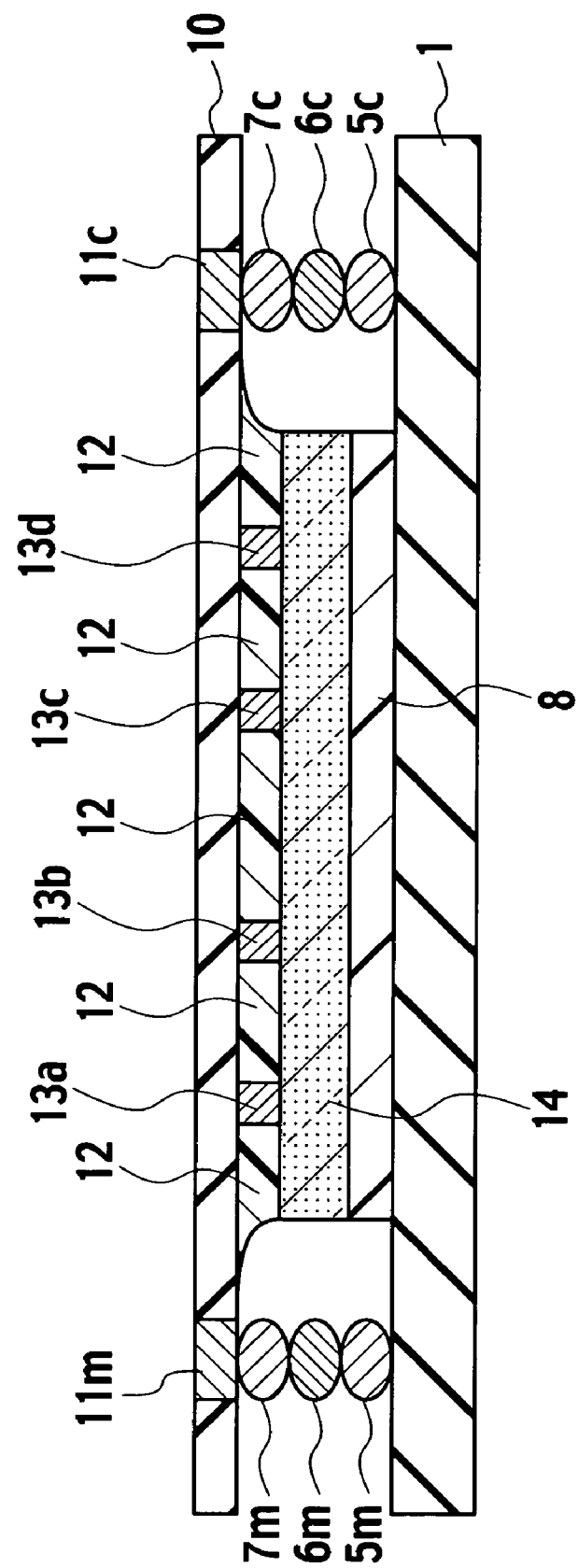
FIG. 3 is a cross-sectional view illustrating the method of assembling the semiconductor device according to the first embodiment of the present invention.

A method of assembling a semiconductor device according to the first embodiment of the present invention is described by using FIGS. 2 and 3.

The base substrate from a resin such, as glass epoxy, polyimide or the like is prepared. As shown in FIG. 2, the first lower joints 5c, 5m are provided on the base substrate 1, respectively. The first intermediate joints 6c, 6m are provided on the first lower joints 5c, 5m, respectively. The first upper joints 7c, 7m are provided on the first intermediate joints 6c, 6m, respectively. The first lower joints 5c, 5m, the first intermediate joints 6c, 6m, and the first upper joints 7c, 7m may be provided by use of a ball mounter.

The first fixing layer 8 is positioned on the area of the base substrate 1 where the first semiconductor chip 14 is mounted. As the first fixing layer 8, the resin sheet made from epoxy resin or acrylic resin may be suitable. The first fixing layer 8 is patterned to have an outer contour aligned with a contour of the first semiconductor chip 14.

The first substrate 10 having the via plugs 11c, 11m, . . . penetrating through the top and bottom surfaces of the first substrate 10 is prepared. The first semiconductor chip 14 is mounted on the bottom surface of the first substrate 10 through the first chip connection electrodes 13a, 13b, 13c, and 13d. The first chip covering layer 12 is provided around the first chip connection electrodes 13a, 13b, 13c, and 13d.

As shown in FIG. 3, the bottom surface of the first substrate 10 is faced to the base substrate 1. The first semiconductor chip 14 is adhered to the first fixing layer 8. The first semiconductor chip 14 is fixed on the base substrate 1 by melting and curing the first fixing layer 8. Then, the base substrate 1 and the first substrate 10 is connected by reflowing the first lower joints 5c, 5m, the first intermediate joints 6c, 6m, and the first upper joints 7c, 7m. The first substrate encapsulating layer 9 is filled around the first lower joints 5c, 5m, the first intermediate joints 6c, 6m, and the first upper joints 7c, 7m, by vacuum printing, molding, potting, or the like. The first substrate encapsulating layer 9 is cured and the semiconductor device. Then, the semiconductor device as shown in FIGS. 1A and 1B is manufactured.

Alternatively, when the reactive liquid resin with a solder fluxing function for soldering interconnect is used as the first encapsulating layer 9, the first lower joints 5c, 5m, the first intermediate joints 6c, 6m, and the first upper joints 7c, 7m may be connected during filling the first encapsulating layer simultaneously.

In accordance with the assembling method of the semiconductor device of the first embodiment, the first semiconductor chip 14 is first fixed when assembling the first substrate 10 on the base substrate 1. And then, the first semiconductor chip 14 provided between the base substrate 1 and the first substrate 10 is encapsulated by use of the first encapsulating layer 9. Accordingly, the misalignment of the base substrate 1 and the first substrate 10 caused by the flowage of the first encapsulating layer 9 is suppressed and the semiconductor device assembled with high accuracy will be manufactured. Moreover, since the first substrate 10 is mounted directly on the base substrate with the first lower joints 5c, 5m, the intermediate layer, which connects upper and lower boards, is unnecessary. Accordingly, the manufacturing process will be simplified at a low cost.

MODIFICATION OF THE FIRST EMBODIMENT

Figure 4:
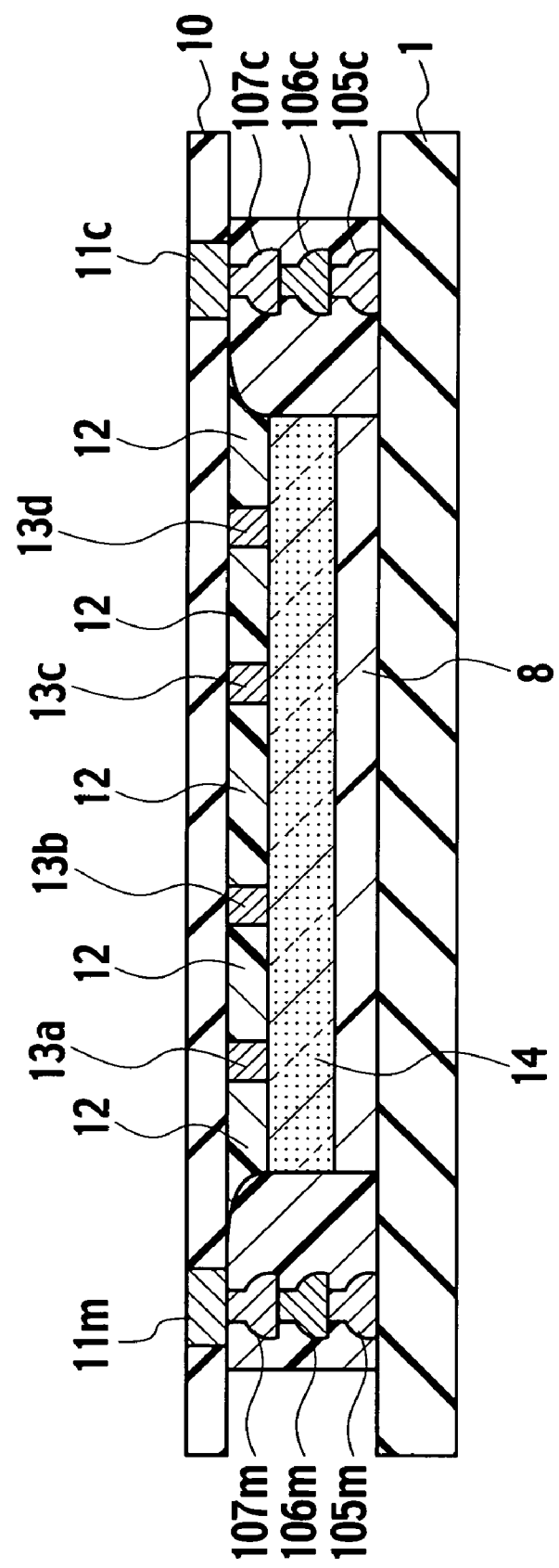
FIG. 4 is a cross-sectional view illustrating the semiconductor device according to a modification of the first embodiment of the present invention.

As shown in FIG. 4, a semiconductor device according to a modification of the first embodiment differs from the semiconductor device as shown in FIGS. 1A and 1B in that first lower connection bumps 105c, 105m, first intermediate connection bumps 106c, 106m, and first upper connection bumps 107c, 107m are provided between the base substrate 1 and the first substrate 10.

As the material of the first lower connection bumps 105c, 105m, the first intermediate connection bumps 106c, 106m, and the first upper connection bumps 107c, 107m, metallic stud bump electrode made of gold, or the like, may be suitable. The base substrate 1 and the first substrate 10 are connected by applying physical oscillation, such as supersonic wave, to the first intermediate connection bumps 106c, 106m, and the first upper connection bumps 107c, 107m.

In accordance with the semiconductor device as shown in FIG. 4, the misalignment of the base substrate 1 and the first substrate 10 caused by the flowage of the first encapsulating layer 9 is suppressed and the semiconductor device assembled with high accuracy will be manufactured. Moreover, since the first substrate 10 is mounted directly on the base substrate with the first lower connection bumps 105c, 105m, the intermediate layer, which connects upper and lower boards, is unnecessary. Accordingly, the manufacturing process will be simplified at a low cost.

SECOND EMBODIMENT

Figure 5:
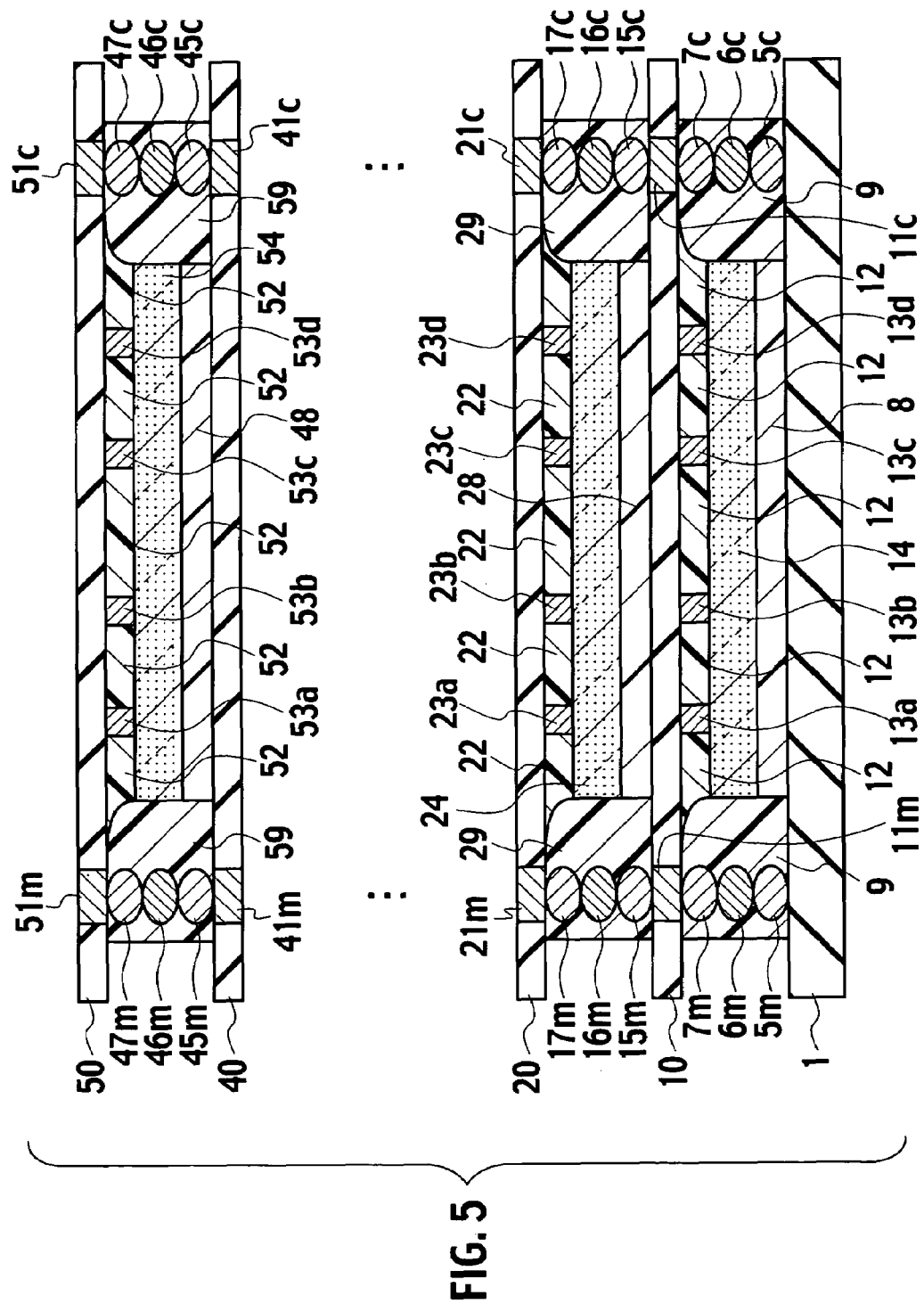
FIG. 5 is a cross-sectional view illustrating a semiconductor device according to a second embodiment of the present invention.

As shown in FIG. 5, a semiconductor device according to a second embodiment of the present invention differs from the semiconductor device as shown in FIGS. 1A and 1B in that a plurality of semiconductor chips (a second semiconductor chip 24, . . . , a k-th semiconductor chip 54) is stacked on the first substrate 10.

The second semiconductor chip 24 is provided on the first substrate 10 through a second fixing layer 28. As a material of the second fixing layer 28, a synthetic resin sheet made of epoxy resin or acrylic resin may be used. The second semiconductor chip 24 is connected to wirings (not shown) provided on a bottom surface of the second substrate 20 through second chip connection electrodes 23a, 23b, 23c, and 23d, which are connected to the element surface of the semiconductor chip 24.

A plurality of via plugs 21c, 21m, . . . are buried in the second substrate 20. The via plugs 21c, 21m, . . . penetrate through the top surface and bottom surface of the second substrate 10. A plurality of second connection members (second lower joints 15c, 15m, second intermediate joints 16c, 16m, and second upper joints 17c, 17m) are provided between the via plugs 21c, 21m and the via plugs 11c, 11m.

The first substrate 10 and the second substrate 20 are electrically connected by the second lower joints 15c, 15m, the second intermediate joints 16c, 16m, and the second upper joints 17c, 17m. A second encapsulating layer 29 is provided around the second lower joints 15c, 15m, the second intermediate joints 16c, 16m, and the second upper joints 17c, 17m. As the material for the second encapsulating layer 29, a synthetic liquid resin made from epoxy resin or acrylic resin may be suitable.

The k-th semiconductor chip 54 is fixed on a k-1 the substrate 40, which is provided above the second substrate 20, through a k-th fixing layer 48. The k-th semiconductor chip 54 is connected to wirings (not shown) provided on a bottom surface of the k-th substrate 50, which is the uppermost substrate of the semiconductor device as shown in FIG. 5, through k-th chip connection electrodes 53a, 53b, 53c, and 53d connected to the element surface of the k-th semiconductor chip 54. A k-th chip covering layer 52 is provided around the k-th chip connection electrodes 53a, 53b, 53c, and 53d.

A plurality of via plugs 51c, 51m are buried in the k-th substrate 50. The via plugs 51c, 51m penetrates through the top surface and bottom surface of k-th substrate 50. A plurality of second connection members (k-th lower joints 45c, 45m, k-th intermediate joints 46c, 46m, and k-th upper joints 47c, 47m) are provided between the via plugs 51c, 51m and via plugs 41c, 41m, buried in the k-1 the substrate 40.

In the semiconductor device according to the second embodiment of the present invention, the first to k-th fixing layers 8, 28, . . . , 48 are provided on the base substrate 1, and the first to (k-1)-th substrate 10, . . . , 40, respectively. Since each of the first to k-th semiconductor chips 14, 24, . . . , 54 is fixed on the first to k-th fixing layers 8, 28, . . . , 48, respectively, before filling the first to k-th encapsulating layers 9, 29, . . . , 59, the misalignment caused by flowage of the first to k-th encapsulating layers 9, 29, . . . , 59, can be prevented. Accordingly, the semiconductor device according to the second embodiment can be assembled with high accuracy.

Figure 6:
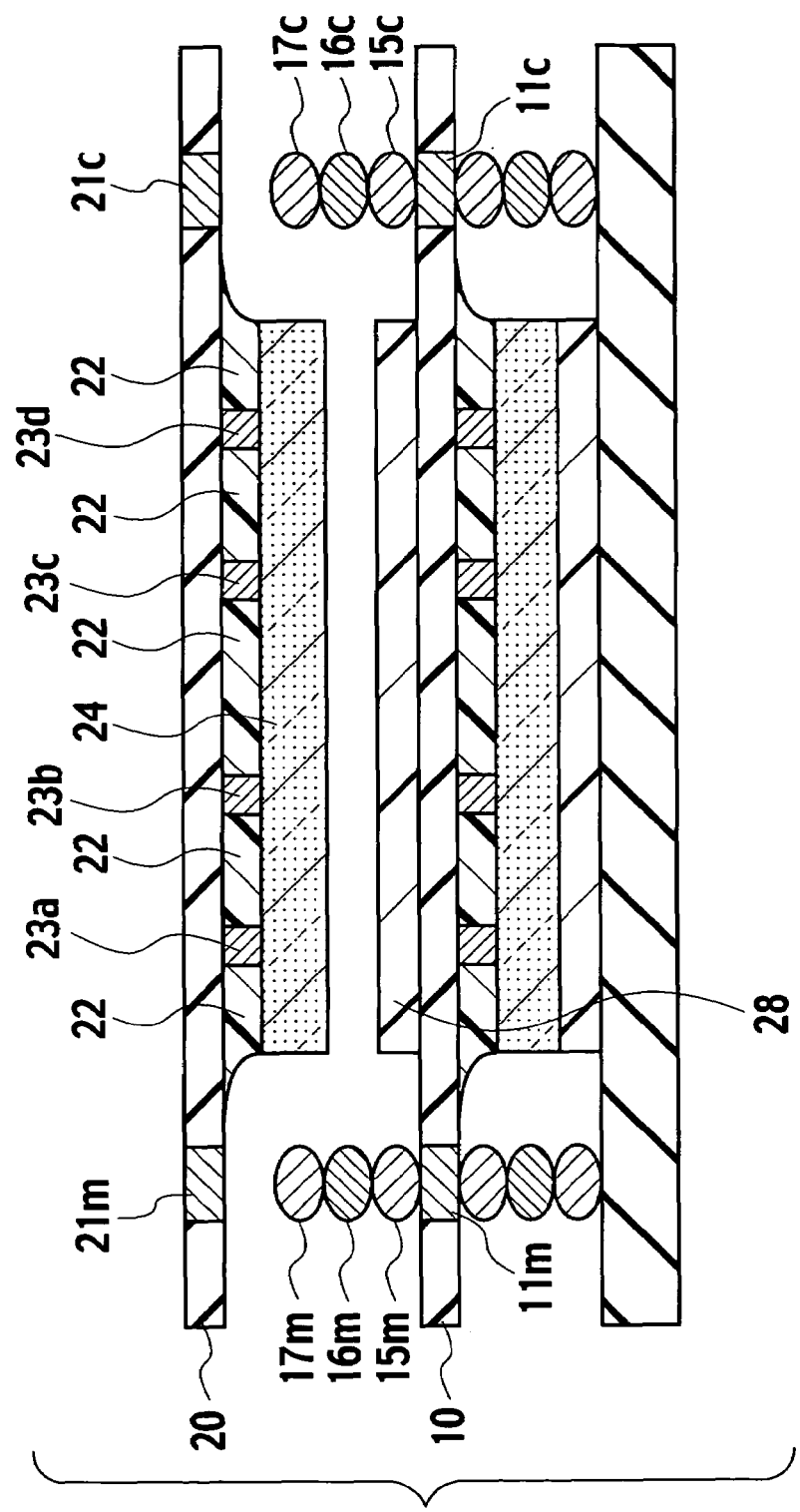
FIG. 6 is across-sectional view illustrating a method of assembling the semiconductor device according to the second embodiment of the present invention.
Figure 7:
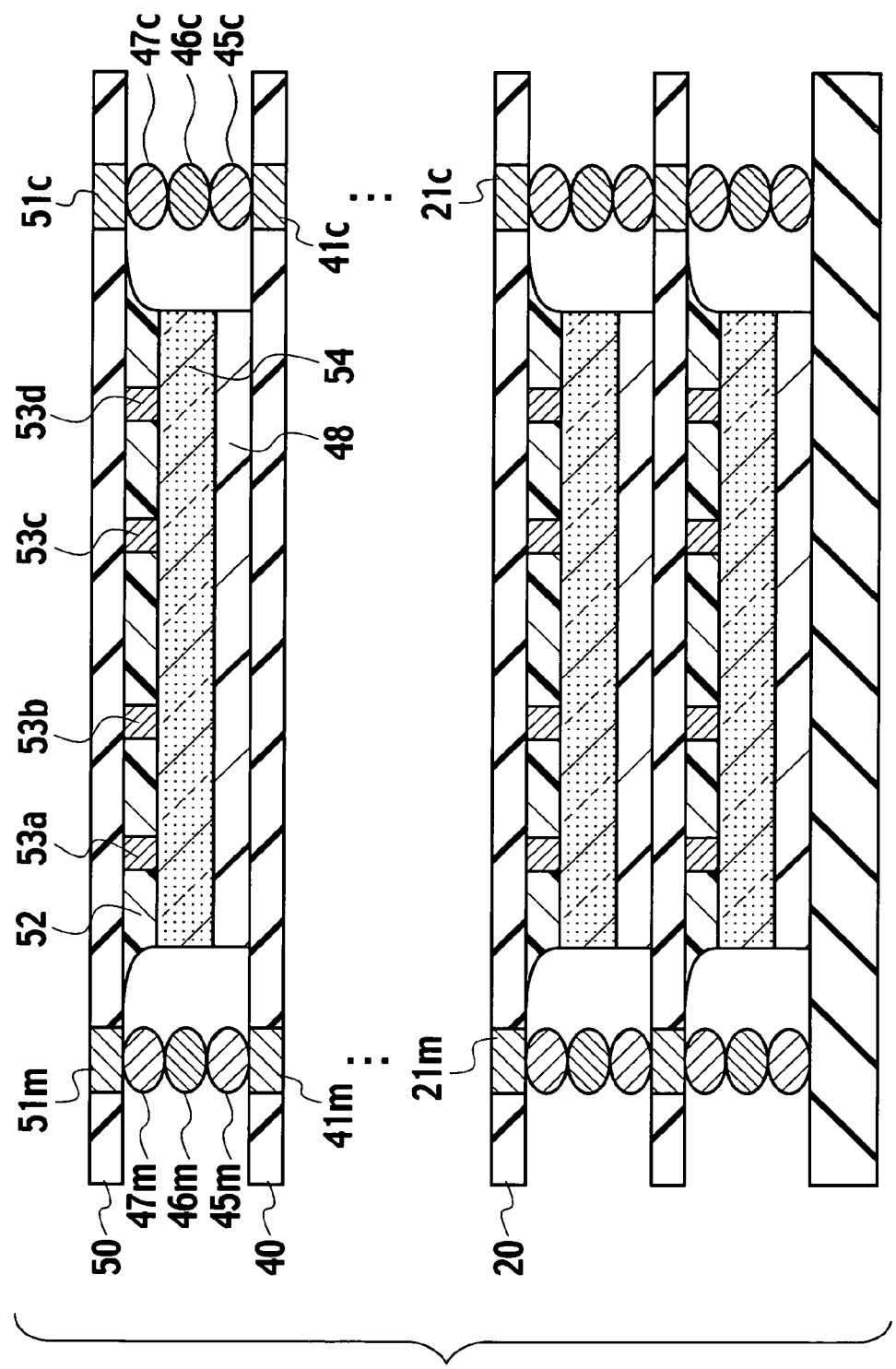
FIG. 7 is a cross-sectional view illustrating the method of assembling the semiconductor device according to the second embodiment of the present invention.

A method of assembling a semiconductor device according to the second embodiment of the present invention is described by using FIGS. 2, 6 and 7.

The base substrate from a resin such, as glass epoxy, polyimide or the like is prepared. As shown in FIG. 2, the first lower joints 5c, 5m are provided on the base substrate 1. The first intermediate joints 6c, 6m are provided on the first lower joints 5c, 5m. The first upper joints 7c, 7m are provided on the first intermediate joints 6c, 6m. The first lower joints 5c, 5m, the first intermediate joints 6c, 6m, and the first upper joints 7c, 7m may be provided by use of the ball mounter.

The first fixing layer 8 is positioned on the area opposing to the first semiconductor chip 14 on the base substrate 1. The first substrate 10 having the first semiconductor chip 14 on the bottom surface is prepared and the bottom surface of the first substrate 10 is faced to the base substrate 1. The first semiconductor chip 14 is adhered to the first fixing layer 8. The first semiconductor chip 14 is fixed on the base substrate 1 by melting and curing the first fixing layer 8.

As shown in FIG. 6, second fixing layer 28 is positioned on the area opposing to the second semiconductor chip 24 on the first substrate 10. The second fixing layer 28 is patterned to have an outer contour aligned with a contour of the second semiconductor chip 24. As the second fixing layer 28, a synthetic resin sheet made of epoxy resin or acrylic resin may be suitable. The second substrate 20 having the second semiconductor chip 24 on the bottom surface is faced to the base substrate 1. The second semiconductor chip 24 is adhered to the second fixing layer 28. The first semiconductor chip 24 is fixed on the first substrate 10 by melting and curing the second fixing layer 28.

A desired amount of the substrates are stacked on the second substrate 20. Finally, as shown in FIG. 7, the k-th fixing layer 48 is provided on the top surface of the k-1 the substrate 40. The k-th substrate 50, which is the uppermost substrate of the semiconductor device in FIG. 5, is faced to the k-th fixing layer 48. The bottom surface of the k-th semiconductor chip 54 is adhered to the k-th fixation layer 48. The k-th semiconductor chip 54 is fixed on the k-1 the substrate 40 by melting and curing the k-the fixing layer 48.

The base substrate 1 and the first substrate 10 is connected by reflowing the first lower joints 5c, 5m, the first intermediate joints 6c, 6m, and the first upper joints 7c, 7m. The first substrate 10 and the second substrate 20 is connected by reflowing the second lower joints 15c, 15m, the second intermediate joints 16c, 16m, and the second upper joints 17c, 17m. Connection members stacked above the second substrate 20 are connected by reflowing, and finally, the k-1 the substrate 40 and the k-th substrate 50 are connected by reflowing the k-th lower joints 45c, 45m, the k-th intermediate joints 46c, 46m, and the k-th upper joints 47c, 47m. The second substrate encapsulating layer 29 is filled around the second lower joints 15c, 15m, the second intermediate joints 16c, 16m, and the second upper joints 17c, 17m, by vacuum printing, molding, potting, or the like. The k-th substrate encapsulating layer 59 is filled around the k-th lower joints 45c, 45m, the k-th intermediate joints 46c, 46m, and the k-th upper joints 47c, 47m, by vacuum printing, molding, potting, or the like. Accordingly, the semiconductor device as shown in FIG. 5 is manufactured.

In accordance with the assembling method of the semiconductor device of the second embodiment, the first to k-th semiconductor chips 14, 24, . . . , 54 are first fixed on the base substrate 1 and the first to k-th substrates 10, 20, . . . , 50, respectively. Then the first to k-th semiconductor chips 14, 24, . . . , 54 are encapsulated by the first to k-th encapsulating layers 9, 29, . . . , 59. Therefore, the misalignments of the base substrate 1, the first to k-th substrates 10, 20, . . . , 50 caused by the flowage of the first to k-th encapsulating layers 9, 29, . . . , 59 are suppressed. Accordingly, the semiconductor device assembled with high accuracy will be manufactured. Moreover, since the first to k-th substrates 10, 20, . . . , 50 are mounted directly on the base substrate 1 with the first to k-the lower joints 5c, 5m, 15c, 15m, 45c, 45m, the intermediate layers, which connects upper and lower substrates, are unnecessary. Accordingly, the manufacturing process will be simplified at a low cost.

OTHER EMBODIMENTS

Various modifications will become possible for those skilled in the art after receiving the teachings of the present disclosure without departing from the scope thereof.

In the first and second embodiments of the present invention, synthetic resins such as polyimide resin, phonolic resin can be used as the material of the encapsulating resin layers in place of the epoxy resin and the acrylic resin. As the first fixing layer 8, the first chip covering layer 12, and the first chip covering layer 9, a plurality of resins having various curing temperatures, curing times, viscosities can be used.

As shown in FIGS. 1A and 1B, the base substrate 1 and the first substrate 10 are connected with the three connection members (the first lower joints 5c, 5m, the first intermediate joints 6c, 6m, and the first upper joints 7c, 7m). However, when the desired height is obtained with one connection member, the number of the connection members is acceptable even by one.

FIG. 2 shows an assembling example, which provides the first connection members (the lower joints 5c, 5m, the first intermediate joints 6c, 6m, and the first upper joints 7c, 7m) on the base substrate 1. However, the first connection members can be stacked on predetermined area on the first substrate 10.

What is claimed is:

1. A semiconductor device, comprising:
a base substrate;
a first fixing layer provided on the base substrate;
a first semiconductor chip fixed on the first fixing layer;
a first substrate provided above the first semiconductor chip;
a first via plug penetrating from a top surface to a bottom surface of the first substrate;
a plurality of stacked first connection members isolated from the first semiconductor chip, and directly connected to the first via plug, for electrically connecting the first substrate with the base substrate; and
a first encapsulating layer provided around the first connection members.

2. The semiconductor device of claim 1, wherein the first fixing layer is made from at least one of epoxy resin and acrylic resin.

3. The semiconductor device of claim 1, wherein an outer contour of the first fixing layer is aligned with a contour of the first semiconductor chip.

4. The semiconductor device of claim 1, wherein the first encapsulating layer is made from at least one of epoxy resin and acrylic resin.

5. The semiconductor device of claim 1, wherein the first connection members surround the first semiconductor chip.

6. The semiconductor device of claim 1, wherein each of the first connection members comprises:
a first lower joint provided on the base substrate;
a first intermediate joint directly stacked on the first lower joint; and a first upper joint directly stacked on the first intermediate joint and connected to the first substrate.

7. The semiconductor device of claim 1, wherein the first connection members are made from a material selected from a group consisting of Pb, Sn—Cu, Sn—Ag, Sn—Ag—Cu, and Sn—Sb.

8. The semiconductor device of claim 1, wherein the first connection members comprise bump electrodes made of gold.

9. The semiconductor device of claim 1, further comprising:
 a plurality of chip connection electrodes connecting the first semiconductor chip with the first substrate; and
 a chip covering layer provided around the first chip connection electrodes.

10. The semiconductor device of claim 1, further comprising:
 a second fixing layer provided on the first substrate;
 a second semiconductor chip fixed on the second fixing layer;
 a second substrate provided above the second semiconductor chip;
 a second via plug penetrating from a top surface to a bottom surface of the second substrate;
 a plurality of stacked second connection members isolated from the second semiconductor chip, and directly connected to the first and second via plugs; and
 a second encapsulating layer provided around the second connection members.

* * * * *